United States Patent [19]

Tanikawa et al.

[11] Patent Number: 4,562,452
[45] Date of Patent: Dec. 31, 1985

[54] CHARGE COUPLED DEVICE HAVING MEANDERING CHANNELS

[75] Inventors: Kunihiro Tanikawa, Akashi; Osamu Ohtsuki, Kobe, both of Japan

[73] Assignee: Fujitsu Limited, Kawasaki, Japan

[21] Appl. No.: 963,922

[22] Filed: Nov. 24, 1978

Related U.S. Application Data

[63] Continuation of Ser. No. 787,759, Apr. 15, 1977, abandoned.

[30] Foreign Application Priority Data

Apr. 15, 1976 [JP] Japan .................................. 51-43371

[51] Int. Cl.[4] ...................... H01L 29/78; G11C 19/28
[52] U.S. Cl. .......................................... 357/24; 357/62
[58] Field of Search .................... 357/24; 367/221 D; 377/57-63

[56] References Cited

U.S. PATENT DOCUMENTS

| | | | |
|---|---|---|---|
| 3,745,383 | 7/1973 | Sangster | 357/24 |
| 3,858,232 | 12/1974 | Boyle et al. | 357/24 |
| 3,921,194 | 11/1975 | Engeler et al. | 357/24 |
| 3,942,163 | 3/1976 | Goyal | 357/24 |
| 3,944,850 | 3/1976 | Walden | 357/24 |

OTHER PUBLICATIONS

Sangster "Integrated Bucket-Brigade Delay Line using, MOS Tetrodes" Philips Technical Review, vol. 31 (1970) p. 266 and Steen "Digital Integrated Circuits with MOSTS" vol. 31 (1970), p. 283.

Ohtsuki et al. "CCD with Meander Channel" 3rd, Int. Conf. Technology and Applications Charge Coupled Devices, Edinburgh (9/76) pp. 38-41.

*Primary Examiner*—Gene M. Munson
*Attorney, Agent, or Firm*—Daniel Jay Tick

[57] ABSTRACT

A charge coupled device transfers a charge via a meandering route in a channel having at least one bend. The selected channel bending angle has a maximum of two right angles, or 180°. When the channel bending angle is less than 180°, the channel may be formed into a ring by being bent a plurality of times. The gate electrode is of simple rectangular form, and is bent at the same angle as the channel where the channel is bent. If the channel is bent at 180°, a signal injected from an input end is transferred to an area adjacent to the input end. The signal may be injected again at the input end for circulation, after amplification.

8 Claims, 11 Drawing Figures

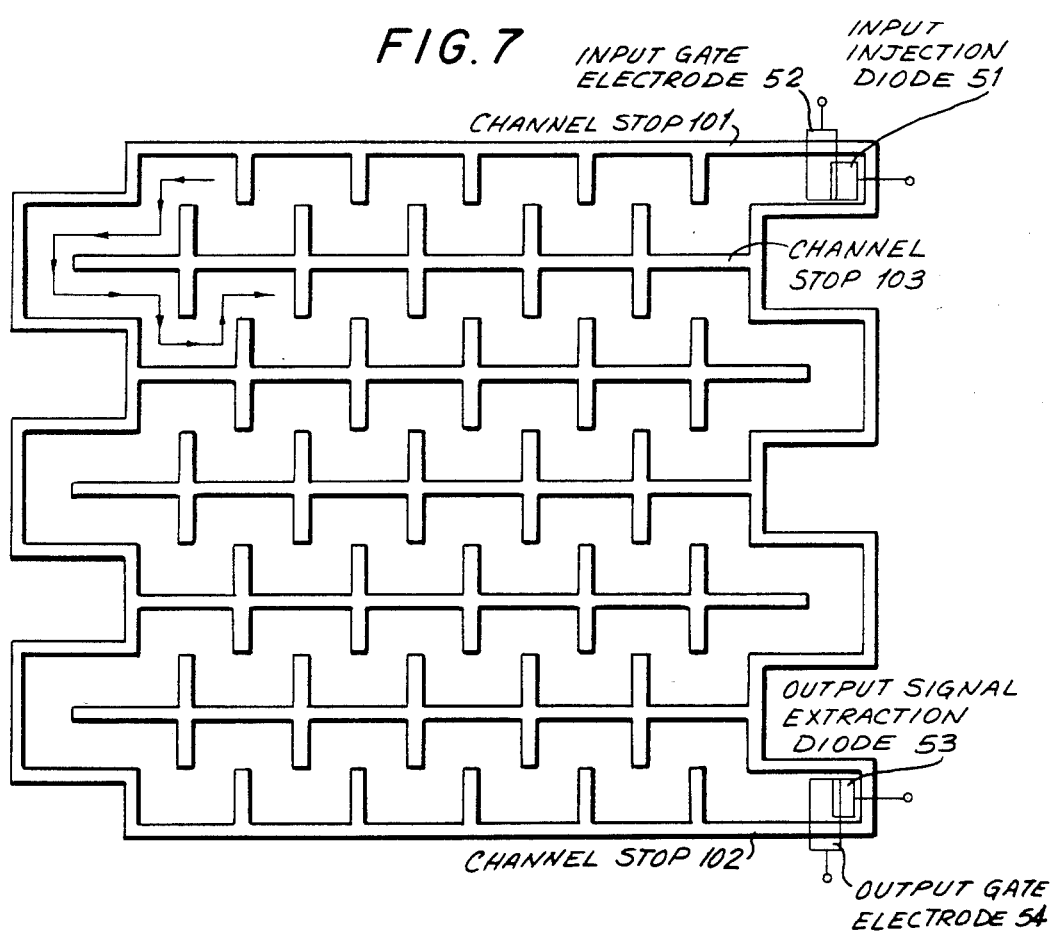

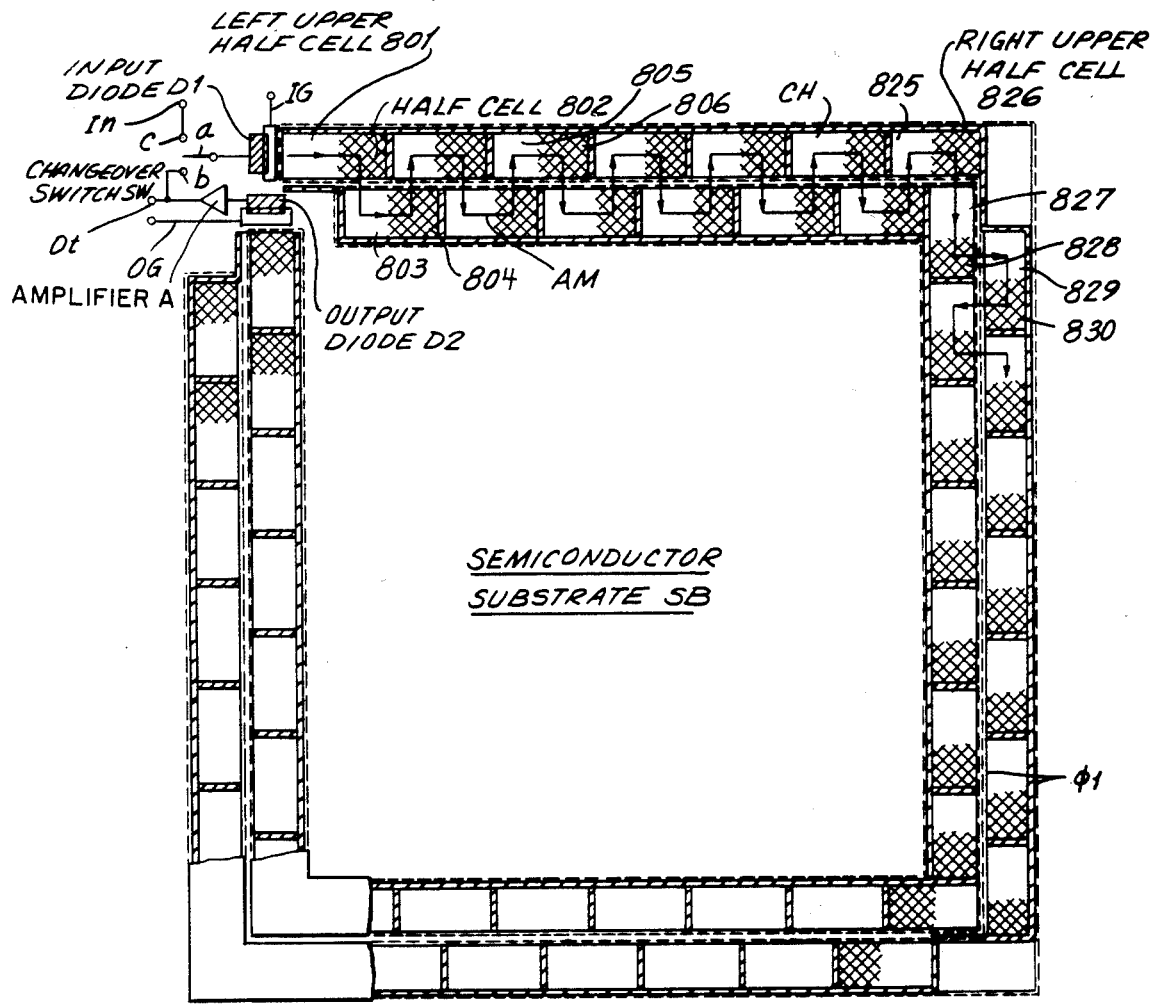

CHARGE COUPLED DEVICE HAVING MEANDERING CHANNELS

This is a continuation of application Ser. No. 787,759, filed Apr. 15, 1977, and now abandoned.

BACKGROUND OF THE INVENTION

The present invention relates to a charge coupled device. More particularly, the invention relates to a charge coupled device having meandering channel or channels.

In a basic type of charge coupled device, known as a CCD, the gate electrodes, which function to transfer the charge, are linearly arranged. The charge is transferred in the direction of such a gate electrode arrangement when pulse trains of specified waveform and different phases are applied to the device. A CCD of this type has a longer electrode arrangement line almost in proportion to the number of transfer stages. Therefore, when the charge is transferred via many stages, the outer form of device is very narrow and long.

On the other hand, a CCD of two-dimensional type, in which the gate electrodes are arranged in the form of matrix, is also well known. In the two-dimensional type, however, all the electrodes in the same column are connected and are always maintained at the same potential. For this reason, in the two-dimensional type, it is impossible to transfer the charge in the direction of a column, and the transfer is always performed in the direction of a row. The charge transfer is performed simultaneously for all the rows.

In any of the aforedescribed types of CCDs, it is very difficult to change the transfer direction by bending a channel at its halfway point. Thus, for example, when the channel is slightly bent in the same direction each time the charge is transferred for one stage, and this is attempted for a plurality of stages, the transfer direction may ultimately be changed to a desired angle such as, for example, 180°. However, this method requires too large substrate area. Furthermore, the configuration of a transversal filter using a CCD of the type in which the transfer direction is bent complicates the wiring pattern and manufacturing process.

The principal object of the invention is to provide a charge coupled device which overcomes the disadvantages of charge coupled devices of known type.

An object of the invention is to provide a charge coupled device of simple structure, having a channel corresponding to that obtained by bending a single meandering channel 180° at a desired point.

Another object of the invention is to provide a charge coupled device which is inexpensive in manufacture, and the bending angle of which may be readily changed to less than 180°, for example to 90°.

Still another object of the invention is to provide a charge coupled device having a channel shape which may form a square route, as a whole, by bending the channel 90° in almost equal lengths at four points.

Yet another object of the invention is to provide a charge coupled device in which a signal may be extracted from the side of the channel or injected in the side of the channel with facility.

Another object of the invention is to provide a charge coupled device of very compact structure.

Still another object of the invention is to provide a charge coupled device in which the channel is easily bent and the bus lines and gate electrodes are simple in form whereby the manufacturing process is simplified.

Yet another object of the invention is to provide a charge coupled device of simple structure, which is inexpensive in manufacture, and which functions efficiently, effectively and reliably without the need for a large substrate area for bending.

BRIEF SUMMARY OF THE INVENTION

The CCD of the invention has a meandering channel and a bending point in the channel. The basic structure of the CCD of the invention has a single channel stop in parallel with two parallel belt-shaped channel stops at their center. Corresponding ends of the two channel stops are connected to each other. The single channel stop is terminated in an area slightly spaced from the connecting part of the two channel stops. Furthermore, each of the two channel stops has short portions extending toward the other and the center channel stop has short portions extending toward the two channel stops on both sides thereof. The channel stop pattern forms meandering channels on both sides of the center channel stop. The charge is transferred to the area adjacent the connecting part of the two channel stops, turns to the end of the center channel stop, and then travels in the opposite direction via the meandering route.

In other words, the channel corresponds to that obtained by bending a single meandering channel at 180° at a desired point. The bending angle of the channel may be changed with facility to a desired angle such as, for example, 90°, smaller than 180°. Furthermore, the channel shape may form a square route, as a whole, by being bent in almost equal lengths at four points at 90°.

When a ring type channel is provided, a bonding pad may be provided at the inside of the ring.

In the aforedescribed types of CCDs of the invention, having a meandering channel, a signal may be readily extracted from a side of the channel and a signal may be readily injected into a side of the channel. Furthermore, there is no need for a large substrate area for bending.

In accordance with the invention, a charge coupled device having a semiconductor substrate comprises a first channel stop on the substrate having at least two parts extending in spaced parallel relation to each other. A connecting part extends between and joins the two parts. The first channel stop has a plurality of portions extending from each of the two parts thereof toward the other. A second channel stop is provided on the substrate between the two parts of the first channel stop in equidistantly spaced parallel relation with the two parts. The second channel stop terminates by some distance from the connecting part of the first channel stop. The second channel stop has a plurality of portions extending therefrom toward each of the two parts of the first channel stop whereby the substrate between the first and second channel stops, including the area between the second channel stop and the connecting part of the first channel stop, functions as the charge transfer route.

The portions extending from each part of the first channel stop are in spaced parallel relation substantially perpendicular to the parts. The portions extending from the second channel stop are in spaced parallel relations substantially perpendicular to the second channel stop.

Each extending portion of the parts of the first channel stop is intermediate and spaced from the next-adjacent extending portions of the second channel stop. Each extending portion of the second channel stop is intermediate and spaced from the next-adjacent extending portions of the first channel stop.

The extending portions of the first channel stop are equidistantly spaced from the next-adjacent extending portions of the second channel stop. The extending portions of the second channel stop are equidistantly spaced from the next-adjacent extending portions of the first channel stop.

Each of the two parts of the first channel stop has spaced opposite first and second ends substantially in alignment with each other and the connecting part joins said two parts at one of the first and second ends of each thereby forming an open loop. The second channel stop is positioned in the open loop.

Each of the two parts of the first channel stop has spaced opposite first and second ends substantially in alignment with each other. The connecting part joins the two parts at the first end of each. Another connecting part joins the two parts at the second end of each thereby forming a closed loop. The second channel stop is positioned in the closed loop.

A conductive layer for electrical connections is provided on the inner part of the loop formed by the first channel stop.

The connecting part has a narrow projecting portion thereby providing a narrow projecting portion in the channel formed in the area between the second channel stop and the connecting part of the first channel stop.

The first channel stop is bent at a plurality of points at an angle smaller than 180° and the channel formed by the two parts of the first channel stop substantially forms a loop, as a whole.

BRIEF DESCRIPTION OF THE DRAWINGS

In order that the invention may be readily carried into effect, it will now be described with reference to the accompanying drawings, wherein:

FIG. 7 is a view of the channel stop pattern of a two-dimensional CCD of the invention;

FIG. 8 is a schematic diagram, partly cut away and partly in section, of a CCD of the invention having a square route channel;

In the FIGS., the same components are identified by the same reference numerals.

DETAILED DESCRIPTION OF THE INVENTION

Figure 1:
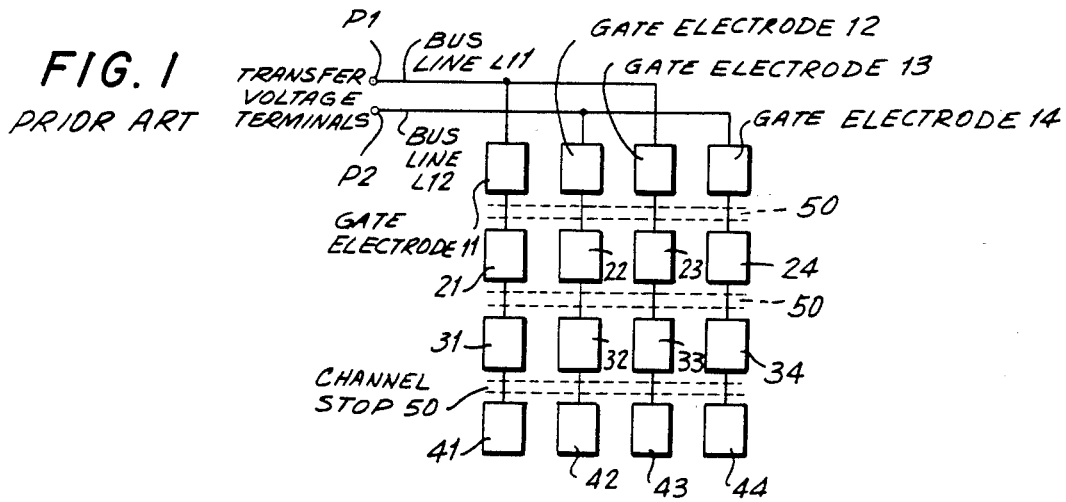
FIG. 1 is a schematic diagram of the electrode layout of a known CCD.

FIG. 1 is a top view of a known type of two-dimensional CCD of two-phase driving type. The gate electrode group arranged vertically such as, for example, the gate electrodes 11, 21, 31 and 41, of the gate electrodes 11 to 44, are connected and are always maintained at the same potential. The channel stop 50, indicated by broken lines in FIG. 1, is thus provided for separating the channels from each other. The charge may thus be transferred to the lateral direction or the direction of a row, but cannot be transferred to the longitudinal direction or the direction of a column.

A charge transfer cannot be accomplished in each row, individually, and a simultaneous charge transfer is accomplished in all the rows. Bus lines L11 and L12 supply pulse trains for charge transfer, hereinafter called a transfer voltage. Terminals P1 and P2 apply transfer voltage to buses L11 and L12.

The CCD of the type of FIG. 1 requires a semiconductor substrate proportional in length to the number of transfer stages, as the number of transfer stages increases.

Figure 2:
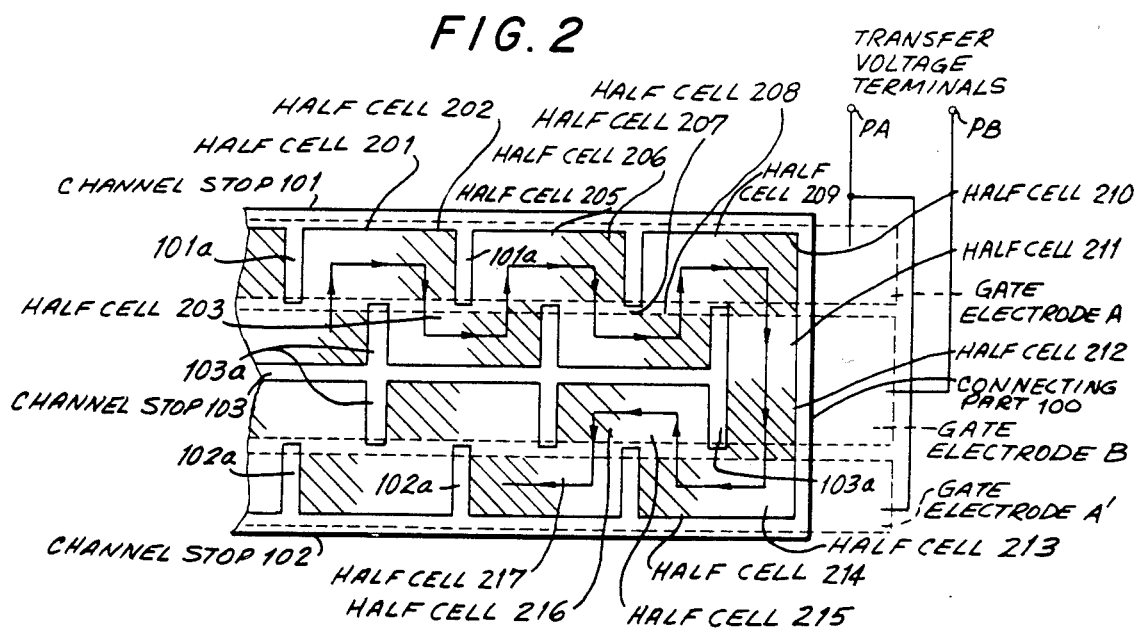
FIG. 2 is a view of part of an embodiment of the CCD of the invention, showing the channel stop pattern.

FIG. 2 shows a basic embodiment of the CCD of the invention. In the view of FIG. 2, the gate electrodes and insulating film on the substrate surface are removed in order to clearly illustrate the channel stop pattern.

In FIG. 2, two parallel belt-shape channel stops 101 and 102 formed on the substrate surface define the outside of the channel, and said two channel stops are connected to each other at the right end of the device by a connecting part 100. In the CCD of FIG. 2, the charge transfer route is in the area defined by both channel stops 101 and 102 on the substrate surface. The connecting part 100 determines the terminating point of the charge transfer route. Furthermore, there is another channel stop 103 midway between the two channel stops 101 and 102, and it extends parallel to the channel stops 101 and 102. The channel stop 103 terminates in an area a short distance from the connecting part 100. As hereinafter described, the charge transfer route is also formed between the channel stop 103 and the connecting part 100.

The channel stops 101 and 102 have short portions 101a and 102a, respectively, extending toward each other. The center channel stop 103 has short portions 103a extending toward the channel stops 101 and 102. The channel stop pattern thus provided is essentially the same as that of the CCD disclosed in pending patent application, Ser. No. 887,655, filed Mar. 17, 1978 as a continuation-in-part of application Ser. No. 735,639, filed Oct. 26, 1976, and now abandoned, and invented by Osamu Ohtsuki one of the inventors of this present invention. The meandering charge transfer route is provided between the two belt-shaped channel stops 101 and 102 with the described channel stop pattern. The charge to be transferred travels via the meandering route between the channel stops 101 and 103, then between the channel stop 103 and the connecting part 100, and then between the channel stops 102 and 103, as indicated by arrows in FIG. 2. The mechanism of the charge transfer is hereinafter explained.

The substrate surface of the CCD of FIG. 2 is covered with electrical insulating material such as, for example, silicon dioxide ($SiO_2$) film, although not shown in the FIGS. The thickness of the $SiO_2$ film differs areally and is thinner at the shadowed parts of FIG. 2 than in the remaining areas. When a specific level of voltage is applied to electrodes formed on the SiO₂ film of varying thickness, as is well known, a depletion layer is generated on the substrate layer just under the SiO₂ film. The depletion layer generated under the thin SiO₂ film is deeper than that generated under the thicker SiO₂ film. It is also well known that the charge, having been transferred to the shallow depletion layer, naturally flows into the deeper depletion layer and is stored there.

The broken lines in FIG. 2 indicate the locations and shapes of the gate electrodes. Three rectangular gate electrodes A, A' and B are shown in the illustrated example of FIG. 2. The gate electrodes A and A' must always be maintained at the same potential and are therefore shown as being separately electrically connected to the transfer voltage terminals PA and PB. A transfer voltage having a phase difference of $\pi$ radians, or a half period, from the transfer voltage applied to the gate electrodes A and A' is applied to the central gate electrode B.

When the substrate is of p conductivity type, the waveform of each transfer voltage is a positive pulse train typically having a constant period. The pulse trains are applied to the gate electrodes A and A', and B via the transfer voltage terminals PA and PB, respectively. Charges to be transferred by the transfer voltage pass each half cell 201, 202, 203, 204, and so on, sequentially along the charge transfer route indicated by the arrows and enter a half cell 210 at the right end of the device. After the charge is stored in half cell 210, when the potential of the gate electrode A becomes zero and that of the gate electrode B becomes positive, the charge is transferred from the half cell 210 to a half cell 211 and is then immediately transferred to a half cell 212.

Thereafter, when the potential of the gate electrodes is inverted and the potential of the gate electrode B becomes zero, while the potential of the gate electrode A' becomes positive, the charge is stored in a half cell 214 after passing a half cell 213. The charge then travels to the left on the meandering route indicated by the arrows between the channel stops 103 and 102 in FIG. 2. The foregoing explains the mechanism of how the charge transfer route is bent 180°, as shown in FIG. 2. Furthermore, the device of FIG. 2 may be considered as that obtained by bending a CCD having a meandering channel at the one point. Additionally, as is clearly indicated in FIG. 2, the CCD of the invention is of very compact configuration.

Figure 3:
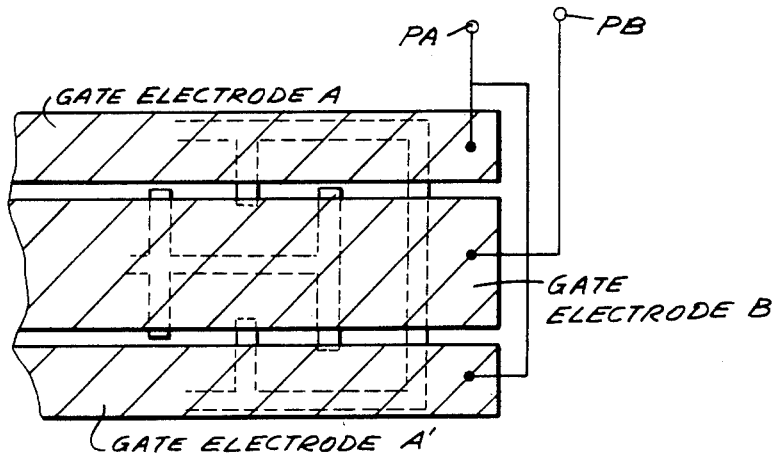
FIG. 3 is a view of part of the embodiment of FIG. 2, showing an embodiment of the gate electrode pattern.

FIG. 3 shows an example of the shape of the gate electrodes. The shape of the gate electrodes is very simple, as clearly shown in FIG. 3. In FIG. 3, the gate electrodes A and A' are electrically connected to each other outside the CCD.

Figure 4:
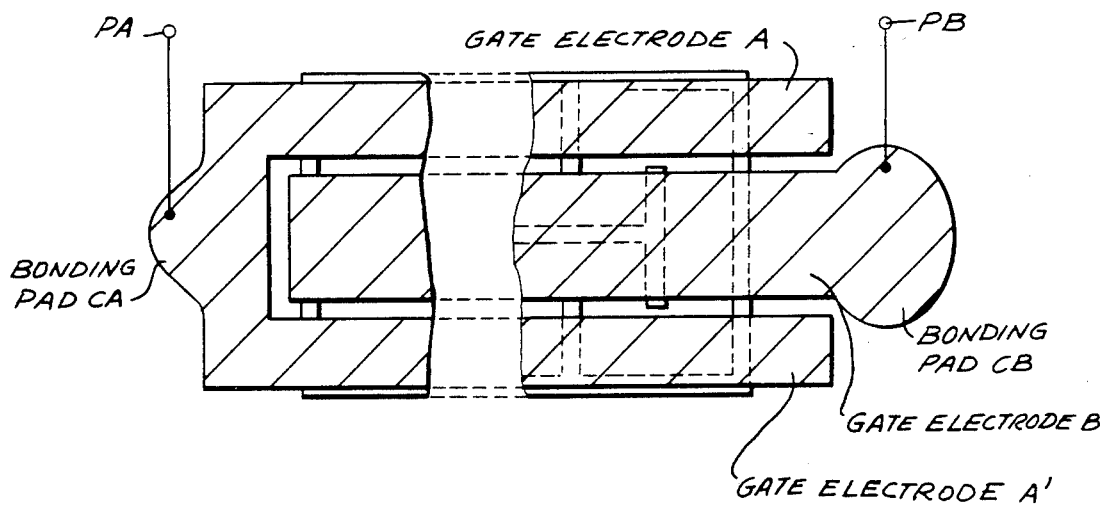
FIG. 4 is a view of the embodiment of FIG. 2, showing another embodiment of the gate electrode pattern.

FIG. 4 shows a different shape of the gate electrodes from that shown in FIG. 1. In the embodiment of FIG. 4, the gate electrodes A and A' are connected to each other at their left ends to form a unitary structure of continuous pattern. The gate electrodes A and A' are provided with a bonding pad CA and the gate electrode B is provided with a bonding pad CB.

Figure 5:
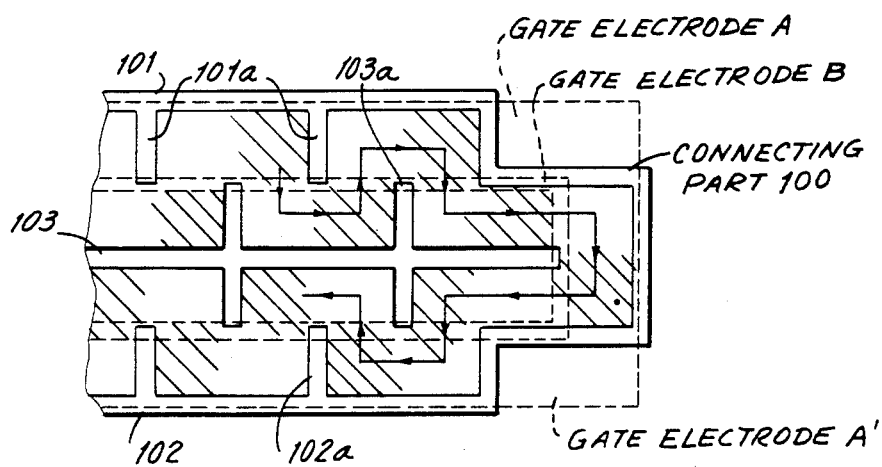
FIG. 5 is a view of part of another embodiment of the CCD of the invention, showing the channel stop pattern.

If the connecting part of the channel stops is not simple, as in the embodiment of FIG. 2, it may have a projecting or extending portion, which may be advantageous in some cases. In the embodiment of FIG. 5, the connecting part 100 of the channel stops projects or extends to the right. The projecting portion has an area of approximately two cells and is added to the channel. In the embodiment of FIG. 5, the gate electrodes A and A' are formed in a unitary structure, as in FIG. 4.

Figure 6:
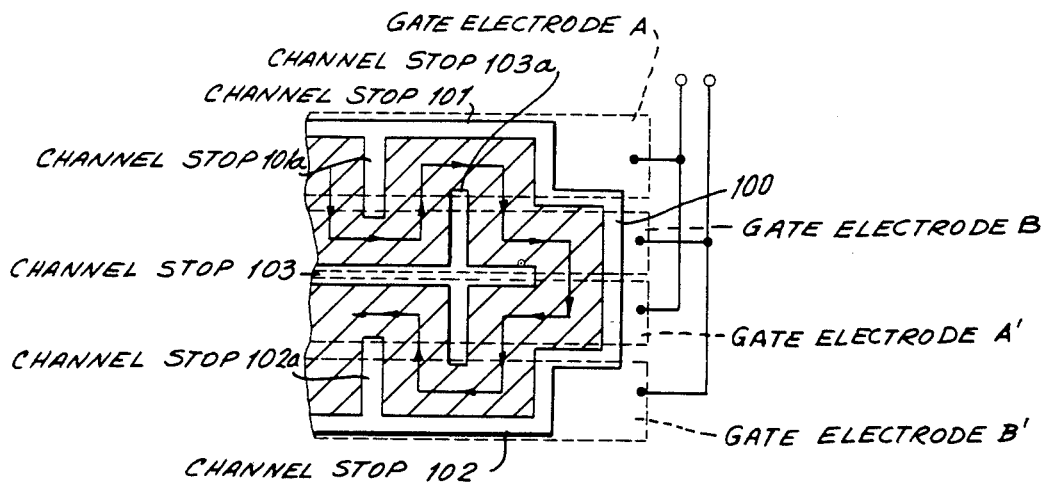
FIG. 6 is a view of part of still another embodiment of the CCD of the invention, showing the channel stop pattern.

In the embodiment of FIG. 6, the projecting portion of the channel is shorter than that of the embodiment of FIG. 5. The gate electrodes A, B, A', B' of the embodiment of FIG. 6 are positioned in sequence and are separate from each other. The gate electrodes A and A' are electrically connected to each other in parallel and the gate electrodes B and B' are electrically connected to each other in parallel.

In the embodiment of FIG. 6, the short extending portions 101a, 102a and 103a of the channel stops 101, 102 and 103, respectively, are slightly longer than in the embodiment of FIG. 5, and thick portion of the SiO₂ film is narrower in width than in the embodiment of FIG. 5, so that the quantity of charge which may be stored is increased as much as possible. The dimensions of the portion having a deeper depletion layer in each cell, indicated by bias line, are considerably greater than half a cell.

FIG. 7 is a view of the channel stop pattern of an embodiment of a two-dimensional CCD of the invention. In the embodiment of FIG. 7, the channel stops are continuous on the whole. The CCD of FIG. 7 includes an input signal injection diode 51, an input gate electrode 52, an output extraction diode 53 and an output gate electrode 54. In the embodiment of FIG. 7, seven strip electrodes function as the transfer gate electrodes.

As hereinbefore stated, the CCD of the invention does not require a wide area of substrate for bending the channel, and has various advantages. One advantage is that the channel may be bent easily. Another advantage is that the bus lines and gate electrodes are simple in form whereby the manufacturing process may be simplified.

In aforedescribed embodiments of the invention, the channel bending angle is almost 180°. The bending angle may easily be reduced, however. FIG. 8 shows an example of a channel bending angle of 90°. In FIG. 8, a mesh pattern is provided in areas where a deep depletion layer is generated. As shown in FIG. 8, the channel is bent at 90° at three points. As a whole, the channel almost forms a square charge transfer route.

The charge to be transferred in FIG. 8 travels sequentially, as indicated by arrows AM, from a left upper half cell 801 to half cells 802, 803, 804, 805, and so on, and enters a right upper half cell 826. Then, when the gate electrode potential is inverted, the charge is transferred to a half cell 828 via a half cell 827 and is then transferred to a half cell 830 via a half cell 829. The charge is transferred via the square charge transfer route, as a whole, by a similar mechanism.

In addition, the transfer charge is provided as input to an amplifier A via an output diode D2 at the end of the channel adjacent the input end, which is the half cell 801. The charge is amplified by the amplifier A and extracted from an output terminal Ot as the output.

A changeover switch SW is provided. The changeover switch SW has a switch arm a coupled to the input end half cell 801 via an input diode D1. The switch arm a is movable to make electrical contact with a switch contact b which is electrically connected to the output terminal Ot, or to make electrical contact with a switch contact c which is electrically connected to an input terminal In, or to make contact with neither contact. When the switch arm a of the switch SW electrically contacts the switch contact b, an output signal is again supplied as input to the half cell 801 via the input diode D1. The charge is thereby circulated. The device of FIG. 8 may thus be used as a memory device.

Figure 9:
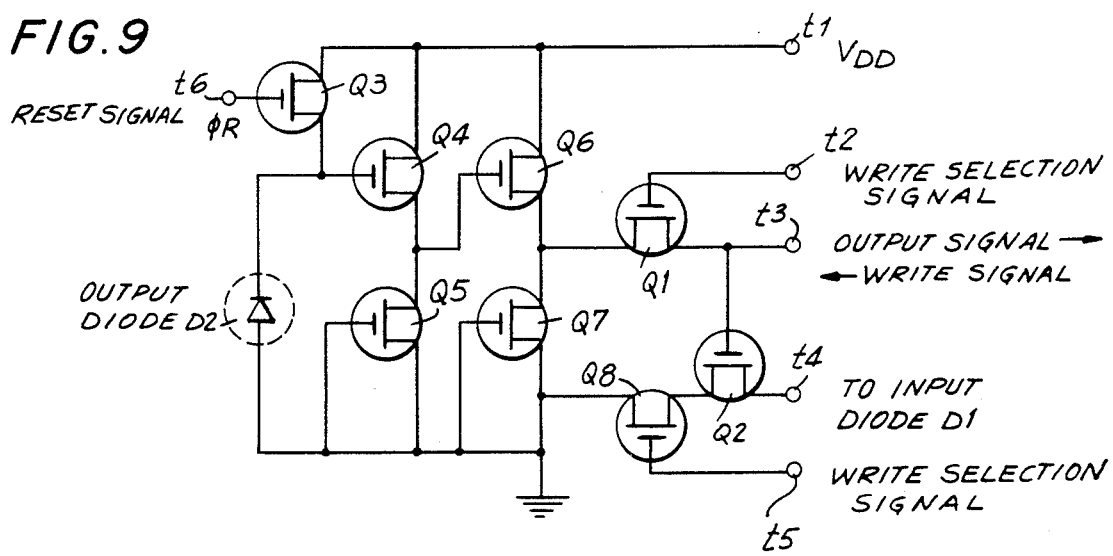
FIG. 9 is a circuit diagram of an embodiment of the amplifier and switch of the CCD of FIG. 8.

FIG. 9 is a circuit diagram of an embodiment of the amplifier A of FIG. 8. The amplifier of FIG. 9 has the output diode D2 and a plurality of field effect transistors or FETs Q1, Q2, Q3, Q4, Q5, Q6, Q7 and Q8. Terminals t1, t2, t3, t4, t5 and t6 are provided for the circuit. A DC power supply voltage VDD is applied to the terminal t1. A write selection signal is supplied to the terminals t2 and t5. A reset signal is supplied to the terminal t6. An output signal is extracted from the terminal t3 or a write signal is supplied as an input to the terminal t3. The terminal t4 is connected to the input diode D1 (not shown in FIG. 9).

Figure 10:
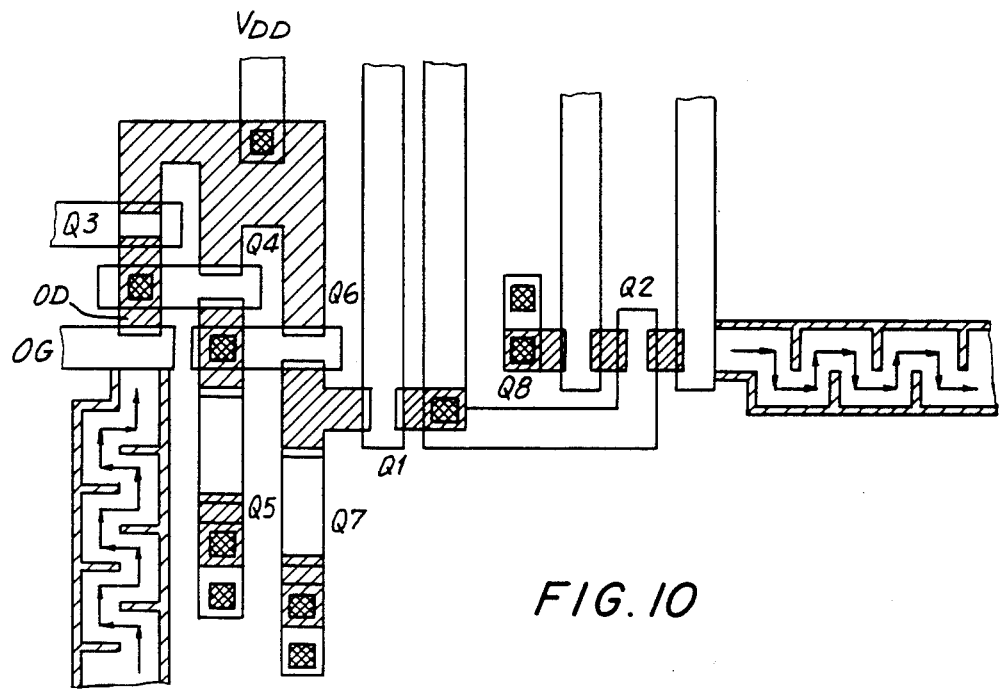
FIG. 10 is a schematic diagram of the integrated circuit of the amplifier and switch of FIG. 9.

FIG. 10 shows a pattern obtained by forming the amplifier A and the CCD on the same semiconductor substrate SB (FIG. 8).

As is obvious from the foregoing explanation, the CCD of the invention may have a very simple structure with a ring-shaped channel. The gate electrodes, as is apparent from FIG. 8, are bent at substantially the same angle as the channel bending angle and are a pair of parallel band-shaped electrodes of simple shape. On the basis of the aforedescribed features, the CCD of the invention may readily provide a tap at its side. When the channel is formed as a ring, the CCD may be provided with a metallic layer at the inner space of the ring-shaped channel, and the layer may be used as a lead wire connection terminal, especially for the use of a bonding pad.

Figure 11:
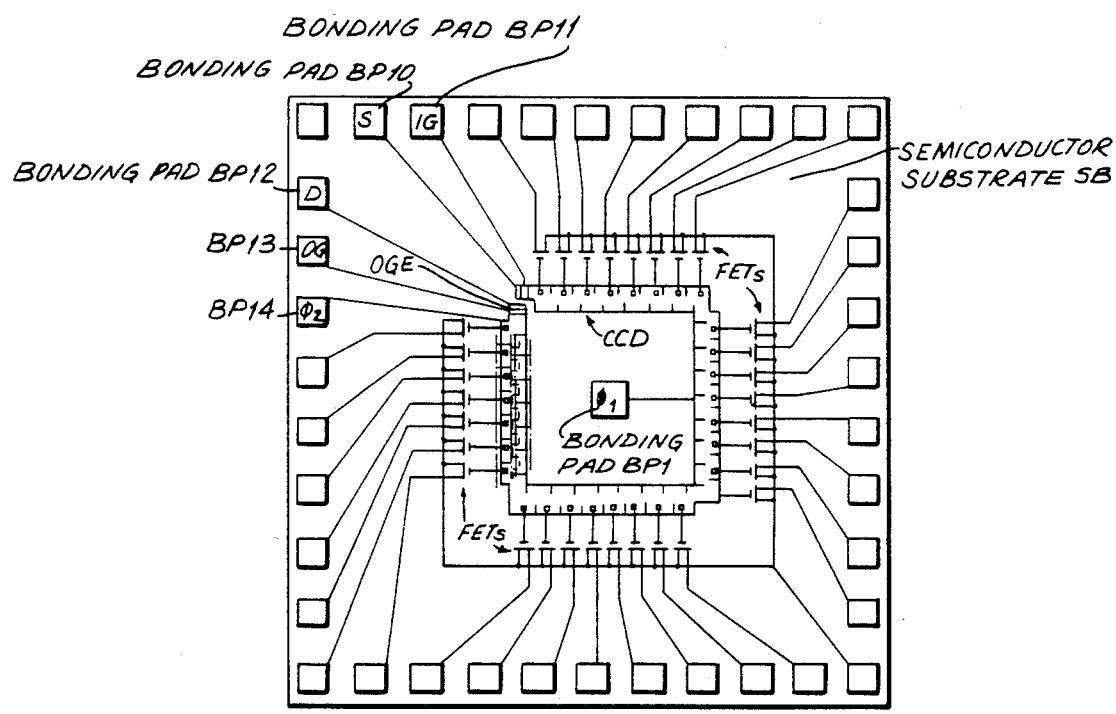
FIG. 11 is a circuit diagram of a transversal filter utilizing the CCD of the invention.

FIG. 11 shows an example of a transversal filter configuration using a CCD of the invention having a ring-shaped channel. A square ring-shaped CCD is formed almost at the center of the semiconductor substrate SB in the embodiment of FIG. 11. A plurality of field effect transistors are arranged in the form of a square-ring around the CCD. A plurality of bonding pads BP10, BP11, BP12, and so on, are arranged on the substrate around the FETs in the same manner.

The ring-shaped CCD of FIG. 11 is substantially the same as that of the embodiment of FIG. 8. In the embodiment of FIG. 11, however, a charge detection diode SD is formed in the channel and is connected to the gate of each field effect transistor. The device of FIG. 11 has a bonding pad BPI at its center.

The CCD of the invention is not limited to the aforedescribed embodiments, and may be adapted to diversified desired formations. Thus, for example, the channel bending angle is not limited to 180° or 90°, and the channel may be bent at any desired angle within 180°. The gate electrodes are bent at any desired angle, at almost the same bending angle as the channel bending angle, at the channel bending point, thereby eliminating a complicated configuration. In addition, the channel may be formed into a circular ring, or a part of an arc, as required.

Although two gate electrodes are shown in the illustrated embodiments, it is possible to utilize a three-phase drive by arranging a third gate electrode at the center, or to provide a single-phase drive by forming an asymmetrical depletion layer by impurity doping into the substrate surface.

While the invention has been described by means of specific examples and in specific embodiments, we do not wish to be limited thereto, for obvious modifications will occur to those skilled in the art without departing from the spirit and scope of the invention.

We claim:

1. A charge coupled device having a semiconductor substrate and at least two charge transfer routes on the substrate mutually connected at a predetermined angle, each of the charge transfer routes comprising a pair of spaced parallel band-shaped channel stops formed on said substrate and defining a charge transfer area therebetween, a plurality of short channel stops alternately extending from each of the band-shaped channel stops toward the center of the charge transfer area, each of the channel stops being a barrier to prevent the transfer of charge, a plurality of cells, each comprising a small area between next-adjacent ones of the short channel stops of a corresponding one of the band-shaped channel stops, said cells being staggered along said charge transfer route, depletion layer forming means for forming an asymmetrical depletion layer in each of the cells in a regular arrangement to determine a transfer direction of the charge, an insulative film covering the charge transfer area, a pair of elongated parallel gate electrodes on the insulative film and having transfer voltages applied thereto to induce charge storage sites whereby charges are transferred along said charge transfer route in each channel, one of the gate electrodes commonly covering the cells of one of the band-shaped channel stops and the other of the gate electrodes commonly covering the cells of the other of the band-shaped channel stops thereby forming a single directional meander-shaped charge transfer channel in the charge transfer area under said pair of gate electrodes, said charge coupled device comprising first cells and end cells in each of said charge transfer routes, the end cell of each of said charge transfer routes having an applied potential of one phase and the first cell of the other of said charge transfer routes having an applied potential of another phase, said end and first cells being coupled at right angles in a coupling area, each of said gate electrodes being bent back on itself on the coupling area and extending continuously toward said charge transfer routes, and four of said charge transfer routes being mutually coupled to form a loop having three coupling areas, said loop surrounding an area defined thereby; and a bonding pad in the area surrounded by said loop for electrical connections.

* * * * *